(12) United States Patent
Yoo et al.

(10) Patent No.: US 7,473,600 B2
(45) Date of Patent: Jan. 6, 2009

(54) NONVOLATILE MEMORY DEVICE AND METHOD OF FORMING THE SAME

(75) Inventors: Hwan-Bae Yoo, Goyang-si (KR); Hyun-Chul Shin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 46 days.

(21) Appl. No.: 11/700,370

(22) Filed: Jan. 31, 2007

(65) Prior Publication Data

US 2007/0184616 A1    Aug. 9, 2007

(30) Foreign Application Priority Data

Feb. 6, 2006    (KR) .................. 10-2006-0011332

(51) Int. Cl.
*H01L 21/336* (2006.01)

(52) U.S. Cl. ...................................... 438/257; 257/315

(58) Field of Classification Search ................ 438/257, 438/258, 259, 262, 266; 257/314–316, 321, 257/E21.66, E21.678
See application file for complete search history.

(56) References Cited

U.S. PATENT DOCUMENTS

| 6,380,032 | B1 * | 4/2002 | Lee et al. ..................... 438/257 |
| 2006/0151824 | A1 | 7/2006 | Lee et al. |

FOREIGN PATENT DOCUMENTS

| JP | 2001-196462 | 7/2001 |
| KR | 2003-0056601 | 7/2003 |
| KR | 2003-0094939 | 12/2003 |
| KR | 1020040004797 | 1/2004 |
| KR | 1020050080705 A | 8/2005 |
| KR | 1020050120860 A | 12/2005 |

* cited by examiner

*Primary Examiner*—David Vu
(74) *Attorney, Agent, or Firm*—Mills & Onello LLP

(57) ABSTRACT

In a method of forming a nonvolatile memory device, and in devices formed according to the method, a hard mask used in patterning a stacked structure constituting a memory cell is simultaneously removed when a device isolation region is removed from a region of the substrate where a common source line is to be formed.

16 Claims, 17 Drawing Sheets

NONVOLATILE MEMORY DEVICE AND METHOD OF FORMING THE SAME

CROSS-REFERENCE TO RELATED APPLICATIONS

This U.S. non-provisional patent application claims priority under 35 U.S.C. § 119 of Korean Patent Application No. 10-2006-0011332, filed on Feb. 6, 2006, the entire content of which is hereby incorporated by reference.

BACKGROUND

Embodiments of the present invention disclosed herein relate to a semiconductor memory device, and more particularly, to a nonvolatile memory device and a method of forming the same.

In general, a semiconductor manufacturing process includes a process of forming a desired pattern by removing any unnecessary portions of a layer through a photolithographic patterning process after forming various types of layers on a substrate. A conductive pattern so formed, for example, may take the form of a line-type pattern such as a gate which extends in a predetermined direction, or an island-like conductive pattern such as a bottom electrode of a capacitor. In order to embody a highly integrated device, it is inevitably desired to reduce the width of the conductive pattern, and to shorten the distance between the adjacent conductive patterns. Such reduction of the width of the conductive pattern, however, causes the resistance of the conductive pattern to be increased, and thus, to maintain a lower resistance, it is necessary to form the conductive pattern as thick as possible. In order to form a conductive pattern of increased thickness, an etching process should be performed using a photoresist pattern after forming a thick conductive layer. However, if the conductive layer is too thick, it is difficult to form the conductive pattern with a desired sidewall profile because the photoresist pattern can become somewhat abraded during the etching process. Therefore, to overcome this problem, the thick conductive layer is patterned using a hard mask layer which is harder than the photoresist, wherein the hard mask layer is formed of a nitride layer, an oxide layer or a combination thereof. Due to this hard mask layer, however, the conductive pattern becomes physically higher than the case of using the photoresist pattern.

Accordingly, as the device becomes more highly integrated, the distance between the adjacent conductive patterns becomes further reduced, whereas the thickness of each conductive pattern is further increased. As a result, the region between the adjacent patterns has a small width and a large height. That is, the region has high aspect ratio.

Meanwhile, an interlayer insulating layer is commonly filled into the region between the adjacent conductive patterns for insulating the adjacent conductive patterns from each other. However, since this region has a high aspect ratio as described above, it is difficult to fill the interlayer insulating layer into this region sufficiently so that there may exist a void in the interlayer insulating layer. When a void is present in the interlayer insulating layer, the adjacent conductive patterns can become electrically connected to each other when later performing a contact-forming process of patterning the interlayer insulating layer and depositing conductive material thereon. Accordingly, it is difficult to secure device reliability.

Therefore, it becomes necessary to remove the hard mask used in forming the conductive pattern. Particularly, in manufacturing a nonvolatile memory device in which a memory cell has a stacked gate structure, it is essential to be able to remove the hard mask through a relatively simple process because the thickness of the layer to be patterned is too great and the region between the adjacent stacked gate structures has a high aspect ratio.

SUMMARY OF THE INVENTION

Embodiments of the present invention provide a reliable memory device and a method of forming the same.

Embodiments of the present invention also provide a nonvolatile memory device and a method of forming the same.

In one aspect, a method of forming a nonvolatile memory device comprises: sequentially forming a memory layer, a control gate and a first mask in sequence on a substrate, the substrate having a trench filled with a device isolation region; removing a portion of the device isolation region at a first side of the control gate, and removing the first mask on the control gate such that a top surface of the control gate is exposed; forming a common source line both in the substrate at the first side of the control gate and in the trench exposed by removing the portion of the device isolation region; and forming a drain in the substrate at a second side of the control gate.

In one embodiment, removing the device isolation region and the first mask comprises: forming a second mask that covers the substrate and the device isolation region at the second side of the control gate, and exposes a top surface of the first mask, and the substrate and the device isolation region at the first side of the control gate; and simultaneously removing the first mask and the device isolation region at the first side of the control gate using the second mask as an etch mask.

In another embodiment, each of the device isolation region and the first mask comprises silicon oxide.

In another embodiment, the common source line and the drain are formed simultaneously by implanting impurity ions after removing the second mask.

In another embodiment, the forming of the second mask comprises: forming a photoresist that covers the substrate and the device isolation region at the second side of the control gate, and a portion of the top surface of the first mask, and exposes the substrate and the device isolation region at the first side of the control gate; and etching a portion of the photoresist such that the top surface of the first mask is entirely exposed.

In another embodiment, each of the device isolation region and the first mask comprises silicon oxide.

In another embodiment, the common source line and the drain region are formed simultaneously by implanting impurity ions after removing the second mask.

In another embodiment, the sequential forming of the memory layer, the control gate and the first mask on the substrate having the trench filled with the device isolation region comprises: patterning the substrate to define an active region and to form the trench extending in a first direction; filling an insulating material into the trench to form the device isolation region; forming a first conductive layer for the memory layer over the active region, wherein a first insulating layer is interposed between the active region and the first conductive layer; forming a second conductive layer for the control gate over the first conductive layer and the device isolation region, wherein a second insulating layer is interposed therebetween; forming the first mask on the second conductive layer, wherein the first mask extends in a second direction which intersects with the first direction; and patterning the second conductive layer, the second insulating layer, the first conductive layer, and the first insulating layer using the first mask as an etch mask.

In another aspect, a method of forming a NOR flash memory device comprises: providing a substrate including a floating gate formed on respective active regions which are defined between device isolation regions extending in a first direction, a plurality of control gates formed on the floating gate and the device isolation regions, and a first mask formed on each of the control gates, wherein a first insulating layer is interposed between the active region and the floating gate, and a second insulating layer is interposed between the control gate and the floating gate, the plurality of control gates extending in a second direction that intersects with the first direction; forming a second mask extending in the second direction, wherein the second mask exposes a common source line region, and partially exposes the top surface of the first mask adjacent to the common source line region, and covers a drain region; removing a portion of the second mask to expose the top surface of the first mask adjacent to the common source line region; removing the first mask and the device isolation region disposed at the common source line region; and implanting impurity ions to form a common source line at the common source line region, and to form a drain at the drain region, after removing the second mask.

In an embodiment, each of the device isolation regions and the first mask comprises silicon oxide.

In another embodiment, the method further comprises: forming an interlayer insulating layer; forming a bit line on the interlayer insulating layer, wherein the bit line is electrically connected to the drains arranged in the first direction through first plugs which penetrate through the interlayer insulating layer, the first plugs being electrically connected to the drains; and forming a source line on the interlayer insulating layer, wherein the source line is electrically connected to the common source line arranged in the second direction through second plugs which penetrate through the interlayer insulating layer, the second plugs being electrically connected to the common source line.

In another embodiment, the top surface of the first mask formed on the control gate adjacent to the second plugs is entirely exposed when the top surface of the first mask adjacent to the common source line region is exposed by partially removing the second mask.

In another embodiment, the portion of the second mask is removed by performing a chemical mechanical polishing (CMP) process over the second mask until the top surface of the control gate is entirely exposed.

In another embodiment, the portion of the second mask is removed using oxygen plasma until the top surface of the control gate is entirely exposed.

In another aspect, a method of forming a NOR flash memory device comprises: forming a first gate structure on a memory region of a substrate, and a second gate structure on a peripheral circuit region of the substrate, wherein the first gate structure includes a first insulating layer, a floating gate, a second insulating layer, a control gate and a first mask which are stacked in sequence, and the second gate structure includes a gate insulating layer, a drive gate and a third mask which are stacked in sequence; forming a second mask such that it exposes a common source line region and partially exposes a top surface of the first mask adjacent to the common source line region in the memory region, and covers the third mask entirely in the peripheral circuit region; removing a portion of the second mask to expose the top surface of the first mask adjacent to the common source line region in the memory region; removing the first mask and the device isolation region of the common source line region in the memory region using the second mask as an etch mask; and implanting impurity ions to form a common source line at the common source line region, and to form a drain at a drain region.

In an embodiment, the removing of the portion of the second mask comprises performing CMP process on the second mask until the top surface of the control gate in the memory region is entirely exposed, the second gate structure being lower in height than the first gate structure relative to the substrate so that the second mask remains on the third mask in the peripheral circuit region.

In another embodiment, the removing of the portion of the second mask comprises removing the second mask using oxygen plasma until the top surface of the control gate in the memory region is entirely exposed, the second gate structure being lower in height than the first gate structure relative to the substrate so that the second mask remains on the third mask in the peripheral circuit region.

In another aspect, a method of forming a nonvolatile memory device comprises: forming two stacked gate structures on a substrate using a first mask; forming a second mask such that it exposes a first region between the two stacked gate structures, and covers a second region beyond the two stacked gate structures, wherein the second region is separated from the first region; removing the first mask using the second mask as an etch mask, and simultaneously removing a device isolation region of the first region; and forming a common source line in the first region and a drain in the second region.

In one embodiment, the forming of the second mask comprises: forming a photoresist layer such that it exposes the first region and covers the second region, wherein the photoresist layer covers a portion of the top surface of the first mask adjacent to the second region and exposes a portion of the top surface of the first mask adjacent to the first region; and removing the portion of the photoresist layer such that the top surface of the first mask adjacent to the second region is partially exposed, thereby entirely exposing the top surface of the first mask.

In another aspect, a NOR flash memory device comprises: memory cells arranged in a matrix form on a substrate; a bit line connected to drains of the memory cells of respective columns; a common source line including sources of the memory cells of respective rows and source connecting units connecting adjacent sources; and a source line connected to the common source line, wherein the memory cell adjacent to the common source line is configured with a first insulating layer, a floating gate, a second insulating layer, and a control gate.

BRIEF DESCRIPTION OF THE FIGURES

The accompanying figures are included to provide a further understanding of the present invention, and are incorporated in, and constitute a part of, this specification. The drawings illustrate exemplary embodiments of the present invention and, together with the description, serve to explain principles of the present invention. In the figures.

DETAILED DESCRIPTION OF PREFERRED EMBODIMENTS

Figure 1:
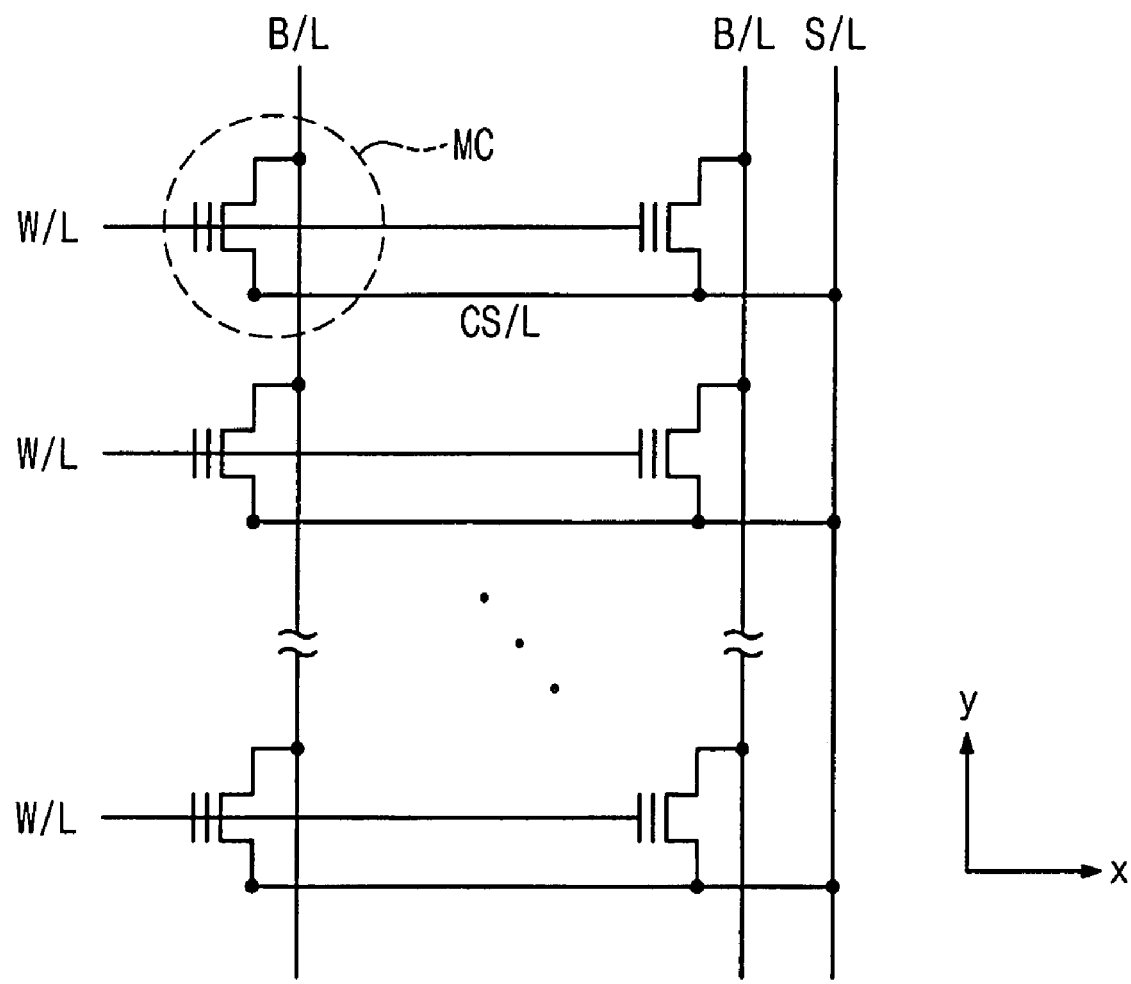
FIG. 1 is an equivalent circuit diagram of a NOR flash memory according to one embodiment of the present invention.

Embodiments of the present invention will be described below in further detail with reference to the accompanying drawings. The present invention may, however, be embodied in different forms and should not be construed as limited to the embodiments set forth herein. Rather, these embodiments are provided so that this disclosure will be thorough and complete.

In the figures, the dimensions of layers and regions are exaggerated for clarity of illustration. It will also be understood that when a layer (or film) is referred to as being 'on' another layer or substrate, it can be directly on the other layer or substrate, or one or more intervening layers may also be present. Further, it will be understood that when a layer is referred to as being 'under' another layer, it can be directly under, and one or more intervening layers may also be present. In addition, it will also be understood that when a layer is referred to as being 'between' two layers, it may be the only layer between the two layers, or one or more intervening layers may also be present. Like reference numerals refer to like elements throughout the specification.

Embodiments of the present invention relate to a process of removing a mask used in forming a conductive pattern in a method of forming a semiconductor memory device, and more particularly, to a process of removing a mask used in forming a memory cell with a stacked gate structure in forming a method of forming a memory device such as a nonvolatile memory device. For the sake of illustrative convenience, descriptions will be focused on a method of forming a flash memory device having a stacked gate structure configured with a tunneling insulating layer, a floating gate operating as a memory layer, a gate interlayer insulating layer, and a control gate operating as a word line. Instead of the floating gate, a charge-trapping layer can be used as a memory layer. For instance, the charge-trapping layer may be formed of nitride. In addition, illustrations will be directed to a NOR flash memory device among various kinds of memory devices.

Hereinafter, an exemplary embodiment of the present invention will be described in conjunction with the accompanying drawings.

Figure 2:
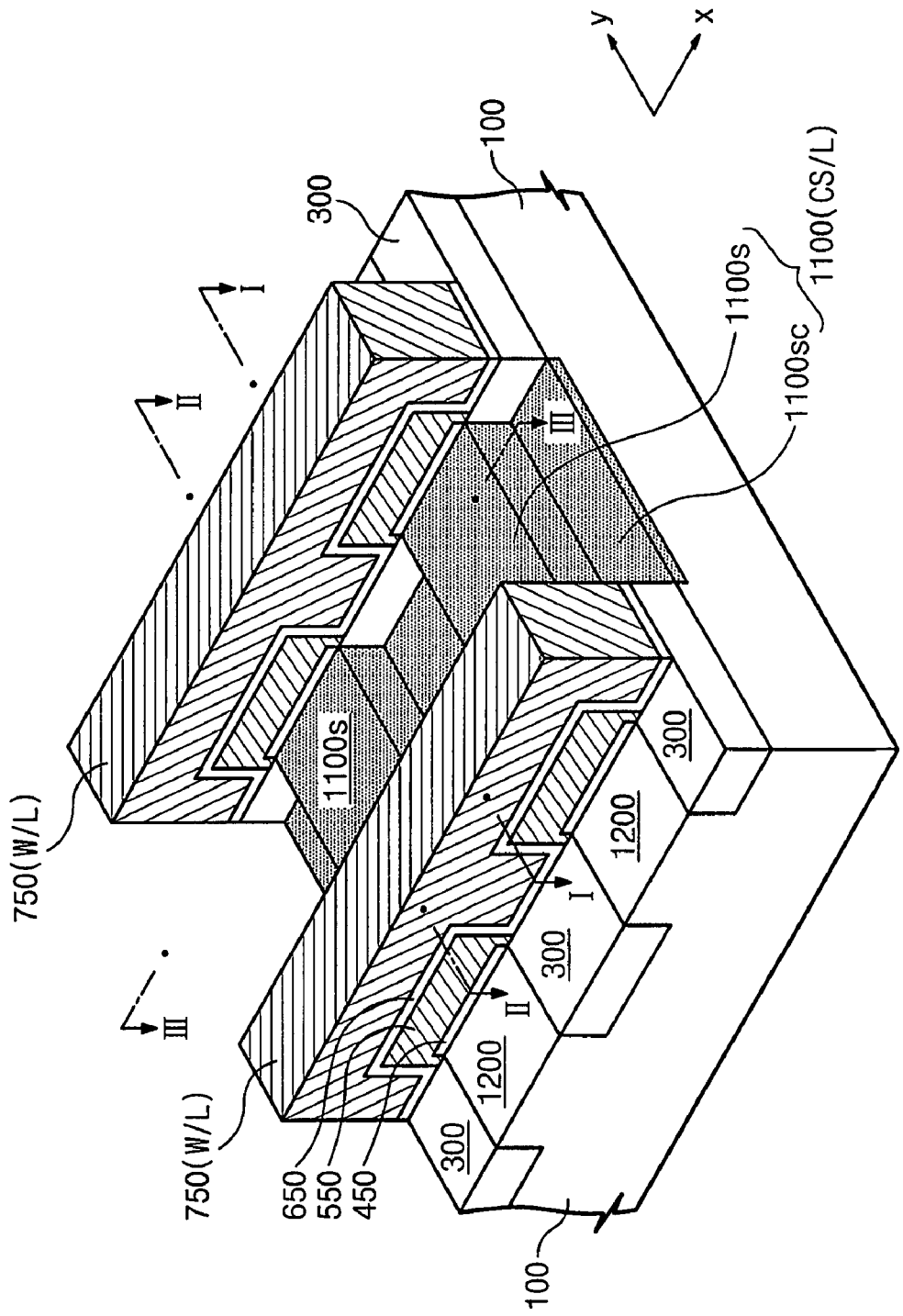
FIG. 2 is a schematic perspective view illustrating a cell structure of memory cells constituting the NOR flash memory of FIG. 1.
Figure 3A:
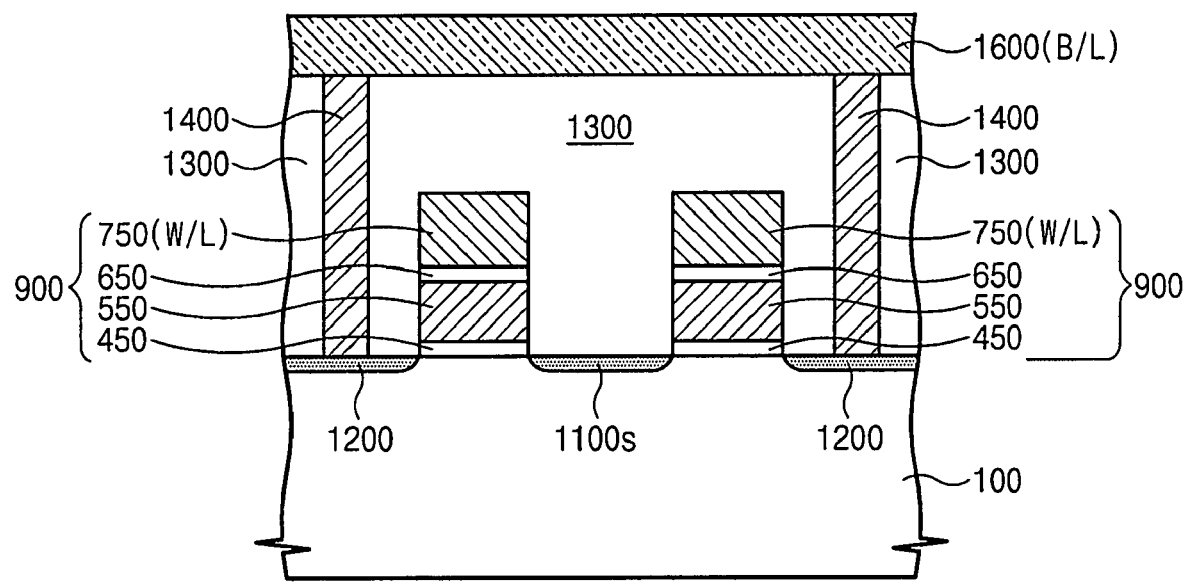
FIGS. 3A through 3C are schematic cross-sectional views illustrating the NOR flash memory of FIG. 1 in detail, which are taken along lines I-I', II-II', and III-III' of FIG. 2, respectively.
Figure 3B:
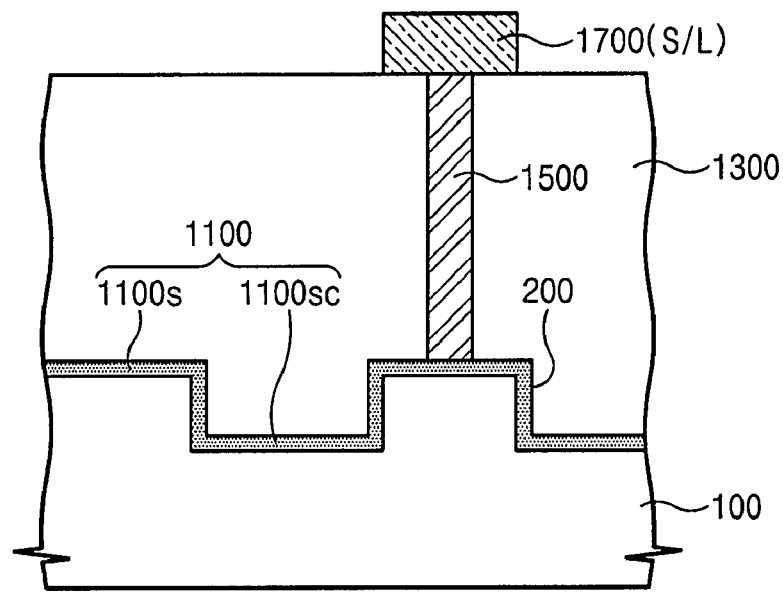
Figure 3C:
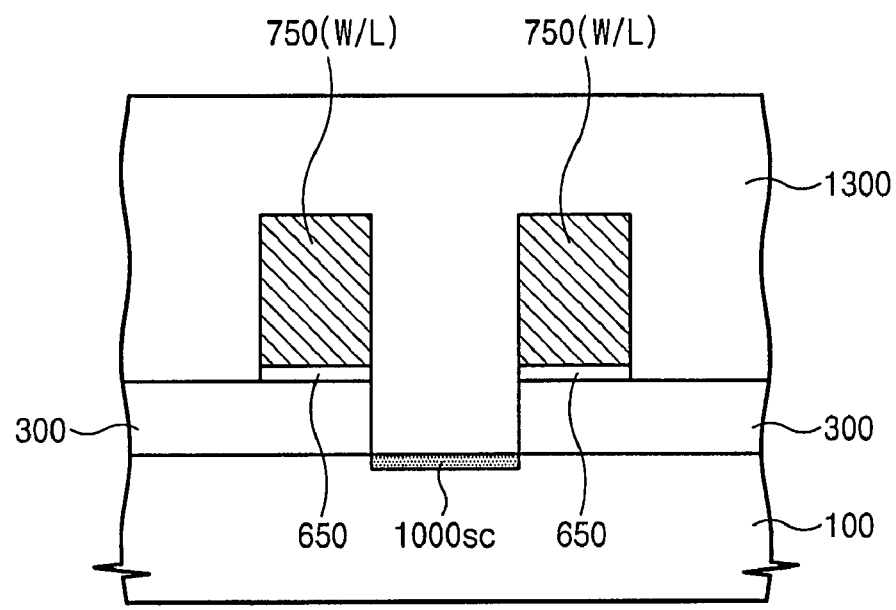

FIG. 1 is an equivalent circuit diagram of a NOR flash memory device according to one embodiment of the present invention, and FIG. 2 is a schematic perspective view illustrating a cell structure of memory cells constituting the NOR flash memory device of FIG. 1. FIGS. 3A through 3C are schematic cross-sectional views illustrating the NOR flash memory of FIG. 1 in detail, which are taken along lines I-I', II-II', and III-III' of FIG. 2, respectively.

Referring to FIGS. 1 and 2, a NOR flash memory device includes a plurality of memory cells (MC) arranged in a matrix form. Sources 1100s of each memory cell arranged in a row direction (x) are connected through a source connection unit 1100sc, thereby forming a common source line (CS/L) 1100. Drains 1200 of each memory cell arranged in a column direction (y) are connected to a bit line (B/L) extending in the column direction. The common source lines (CS/L) 1100, for example, are electrically connected to a source line (S/L) which extends in the column direction. Control gates 750 of each memory cell arranged in the row direction is connected to each other so as to form a word line extending in the row direction.

A memory cell structure of the NOR flash memory according to one embodiment of the present invention will be illustrated more fully with reference to FIGS. 3A through 3C. Referring to FIG. 3A, the memory cell includes a stacked gate structure 900, a source 1100s and a drain 1200 disposed at respective sides of the stacked gate structure 900. The stacked gate structure 900 of the memory cell is configured with a tunnel insulating layer 450, a floating gate 550 operating as a memory layer, a gate interlayer insulating layer 650, and a control gate 750 operating as a word line. The stacked gate structures 900, which are adjacent to each other in the column direction, may share a common source 1100s positioned between them. In addition, the adjacent stacked gate structures 900 arranged in the column direction may share a common drain 1200.

An interlayer insulating layer 1300 is formed to cover the uppermost surface of the stacked gate structure 900, i.e., the uppermost surface of the control gate 750. A bit line 1600 is on the interlayer insulating layer 1300 and is electrically connected to the drain 1200 through a contact plug 1400 penetrating through the interlayer insulating layer 1300. A source line 1700 is electrically connected to the common source line 1100 through a contact plug 1500 which penetrates through the interlayer insulating layer 1300. The source line 1700, for example, may be in contact with the source 1100s of the common source line 1100 or with the source connection unit 1100sc. In the illustrative example of FIG. 3B, the source line 1700 is shown as being electrically connected to the source 1100s of common source line 1100. In addition, although it is illustrated that the source line 1700 seems to be formed at a level that is the same height as the bit line 1600, the source line 1700 may be at a level that is higher or lower than the bit line 1600.

The drains 1200 adjacent to each other in the row direction are insulated from each other by means of a device isolation region 300. Referring to FIG. 3B, the sources 1100s adjacent to each other in the row direction are connected to each other through the source connection unit 1100sc to thereby form the common source line 1100. The common source line 1100 may be formed by removing a portion of the substrate between source regions and implanting impurity ions onto both the source regions and the exposed region of the substrate by removing the portion of the substrate. Accordingly, a bottom surface of the source connection unit 1100sc is lower than that of the device isolation region 300, as illustrated in FIG. 3C.

Methods of fabrication will be set forth more fully with reference to FIGS. 4A through 12A, and FIGS. 4B through 12B. Herein, FIGS. 4A through 12A are cross-sectional views taken along lines I-I' of FIG. 2, and FIGS. 4B through 12B are cross-sectional views taken along lines II-II' of FIG. 2. FIG. 8C is a perspective view corresponding to FIGS. 8A and 8B, and FIG. 9C is a perspective view corresponding to FIGS. 9A and 9B.

Figure 4A:
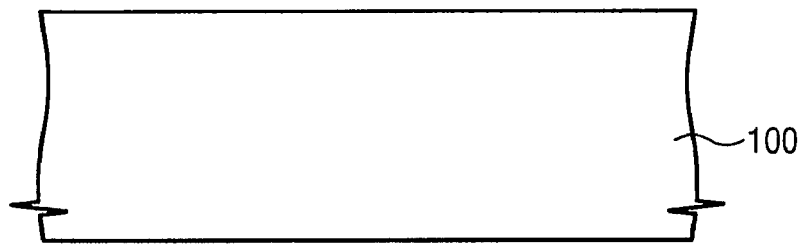
FIGS. 4A through 12A are cross-sectional views taken along lines I-I' of FIG. 2, and FIGS. 4B through 12B are cross-sectional views taken along lines II-II' of FIG. 2, illustrating a method of forming a nonvolatile memory device in accordance with embodiments of the present invention.
Figure 4B:
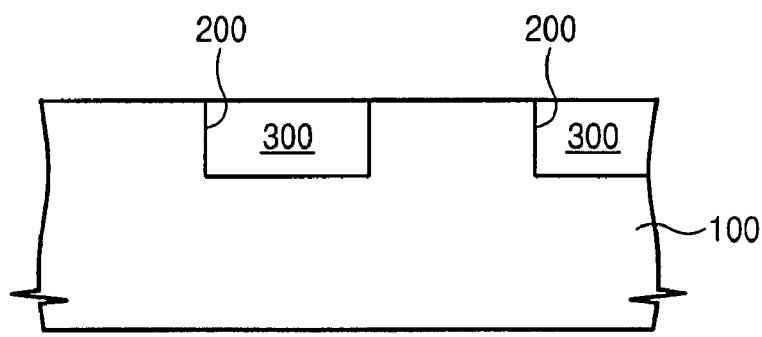

Referring to FIGS. 4A and 4B, the device isolation region 300 is formed on the substrate 100 through a device isolation process, wherein the device isolation region 300 extends in the column direction. Thus, an active region is defined between the device isolation regions 300. The device isolation region 300, for example, may be formed through the following steps. The substrate 100 can be etched to a predetermined depth so as to form a trench therein. Thereafter, an insulating material such as silicon oxide or the like can be filled into the trench 200 to thereby form the device isolation region 300.

Figure 5A:
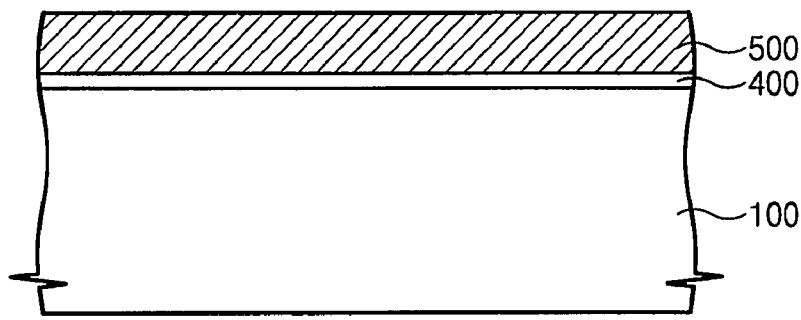
Figure 5B:
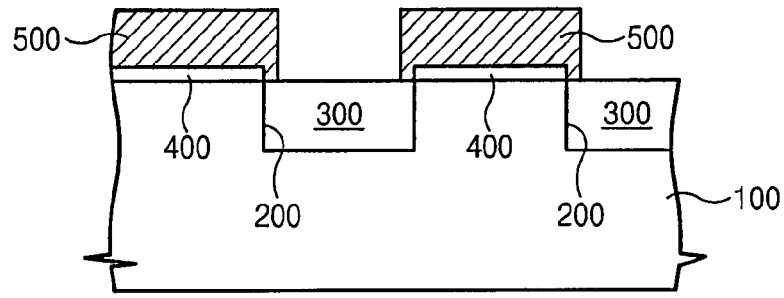

Referring to FIGS. 5A and 5B, a tunneling insulating layer 400 and a first conductive layer 500 for forming a floating gate are formed on the active region in sequence. The first conductive layers 500 extend in the column direction, and the device isolation regions 300 are disposed between the first conductive layers 500. The first conductive layer 500, for example, may be formed on the active region such that one conductive layer 500 is electrically isolated from other conductive layers 500 adjacent thereto in the row direction by forming a silicon layer on the tunneling insulating layer 400 and the device isolation region 300 and then patterning the silicon layer. The first conductive layer 500 can extend over the device isolation region 300 adjacent the active region. The tunneling insulating layer 400, for example, can be formed of silicon oxide using a thermal oxidation process or a vapor deposition process.

Herein, the tunneling insulating layer 400 and the first conductive layer 500 can be patterned simultaneously with the device isolation region 300. That is, the tunneling insulating layer and the silicon layer are deposited on the substrate 100 in sequence and patterned into predetermined configurations, thereby forming a trench etch mask in which the tunneling insulating layer 400 and the first conductive layer 500 are stacked in sequence. Herein, the trench etch mask covers a predetermined region of the substrate which will become an active region, and exposes a region which will become a trench. Thereafter, the substrate 100 is etched using the trench etch mask to thereby form the trench 200. Subsequently, an insulating material is filled into the trench 200 so as to form the device isolation region 300. Therefore, the first conductive layer 500 is formed on the active region in a self-aligned manner.

In addition, the first conductive layer 500 may optionally be configured with a lower silicon pattern and an upper silicon pattern. In other words, after the tunneling insulating layer and the lower silicon layer are deposited on the substrate in sequence, they are patterned into a predetermined shape so as to form a trench etch mask in which the tunneling insulating layer 400 and the lower silicon pattern are stacked in sequence. The trench etch mask covers a predetermined region of the substrate 100 which will become an active region; and exposes a region which will become a trench. Thereafter, the substrate 100 is etched using the trench etch mask to thereby form the trench 200. Subsequently, an insulating material is filled into the trench 200 so as to form the device isolation region 300. Therefore, the lower silicon pattern is formed on the active region in a self-aligned manner. After forming the upper silicon layer on the lower silicon pattern and the device isolation region, they are patterned so as to form an upper silicon pattern on the lower silicon pattern. Thus, formation of the first conductive layer 500 is completed. In alternative embodiments, the upper silicon pattern can optionally also be formed on the side surfaces of the lower silicon pattern in addition to the top surface thereof.

Figure 6A:
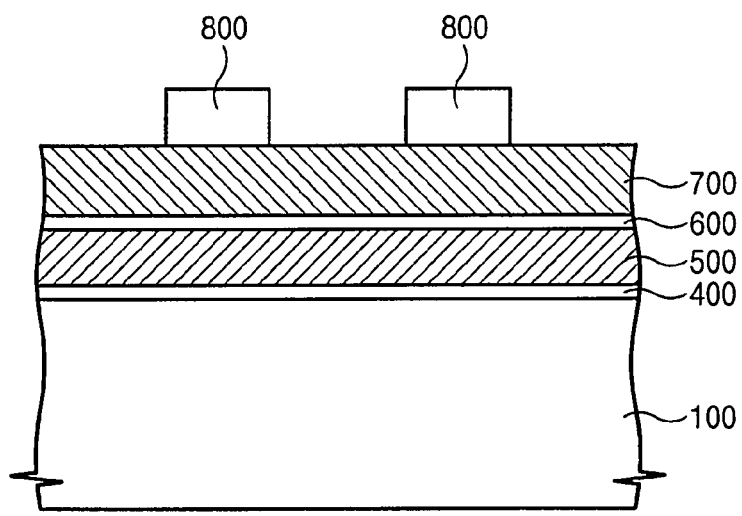
Figure 6B:
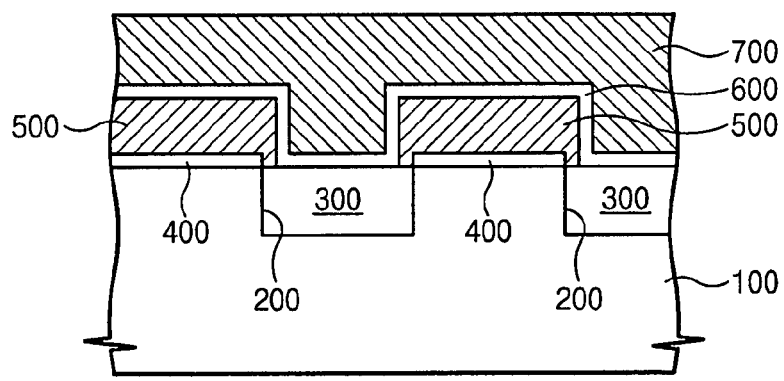

Referring to FIGS. 6A and 6B, a gate interlayer insulating layer 600 and a second conductive layer 700 for use in forming a control gate are formed on the first conductive layer 500 and the device isolation region 300 in sequence. Afterwards, a hard mask 800 is formed on the second conductive layer 700, wherein the hard mask 800 extends in the row direction and defines the control gate. The gate interlayer insulating layer 600, for example, may be formed of an ONO layer in which an oxide layer, a nitride layer, and an oxide layer are stacked in sequence. The second conductive layer 700, for example, may be formed of a silicon layer, silicide, or combinations thereof. Herein, the application of silicide operates to reduce the resistance of the word line.

The hard mask 800 may be formed of any material which does not have an etch selectivity with respect to the device isolation region 300. For example, the hard mask 800 may be formed of silicon oxide. Herein, a material that does not have etch selectivity with respect to another material means that the materials exhibit substantially at the same etch rate when etching both materials using a predetermined etch gas or etch solution.

Figure 7A:
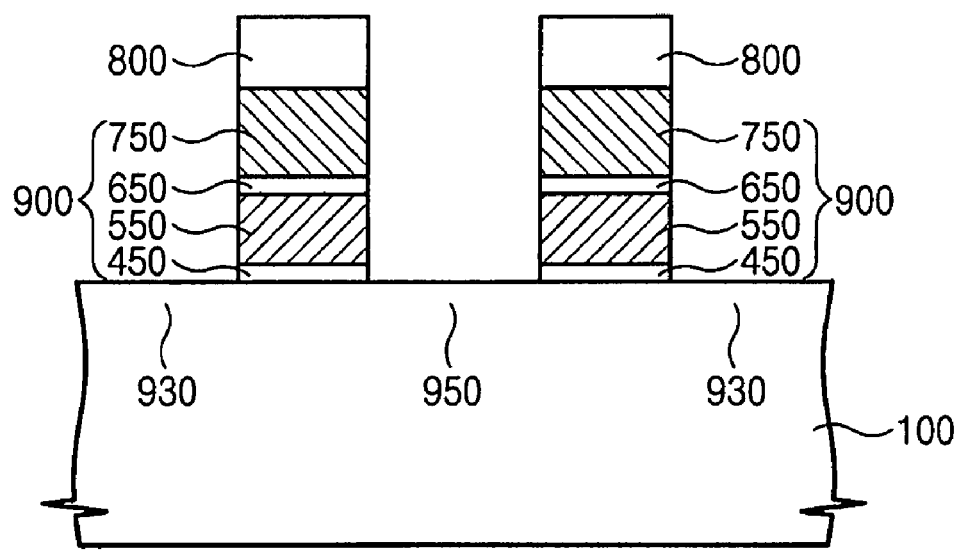
Figure 7B:
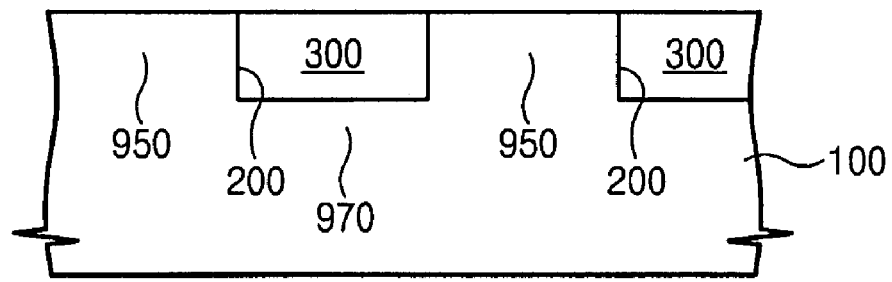
Figure 8A:
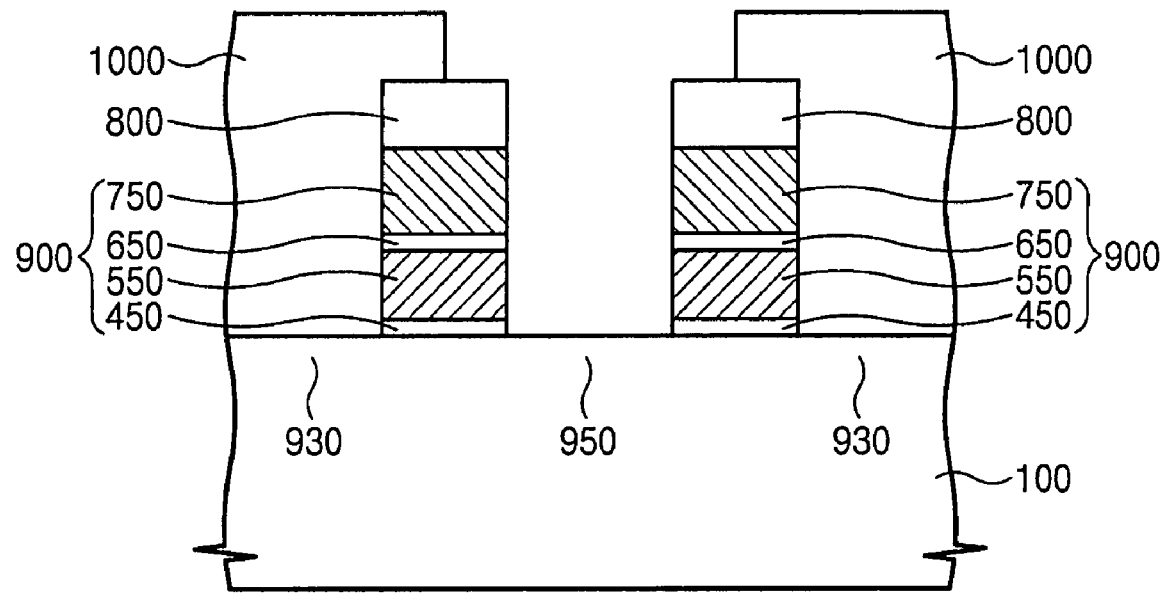
FIG. 8C is a perspective view corresponding to FIGS. 8A and 8B.
Figure 8B:
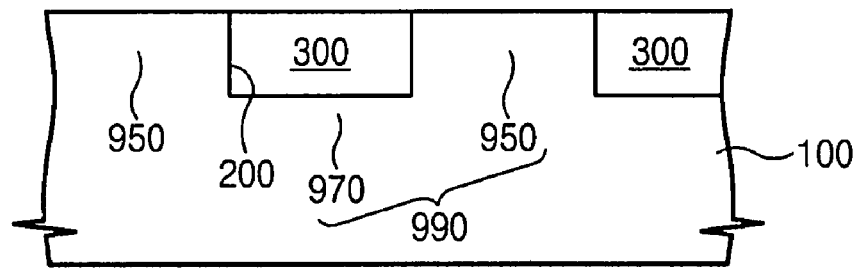
Figure 8C:
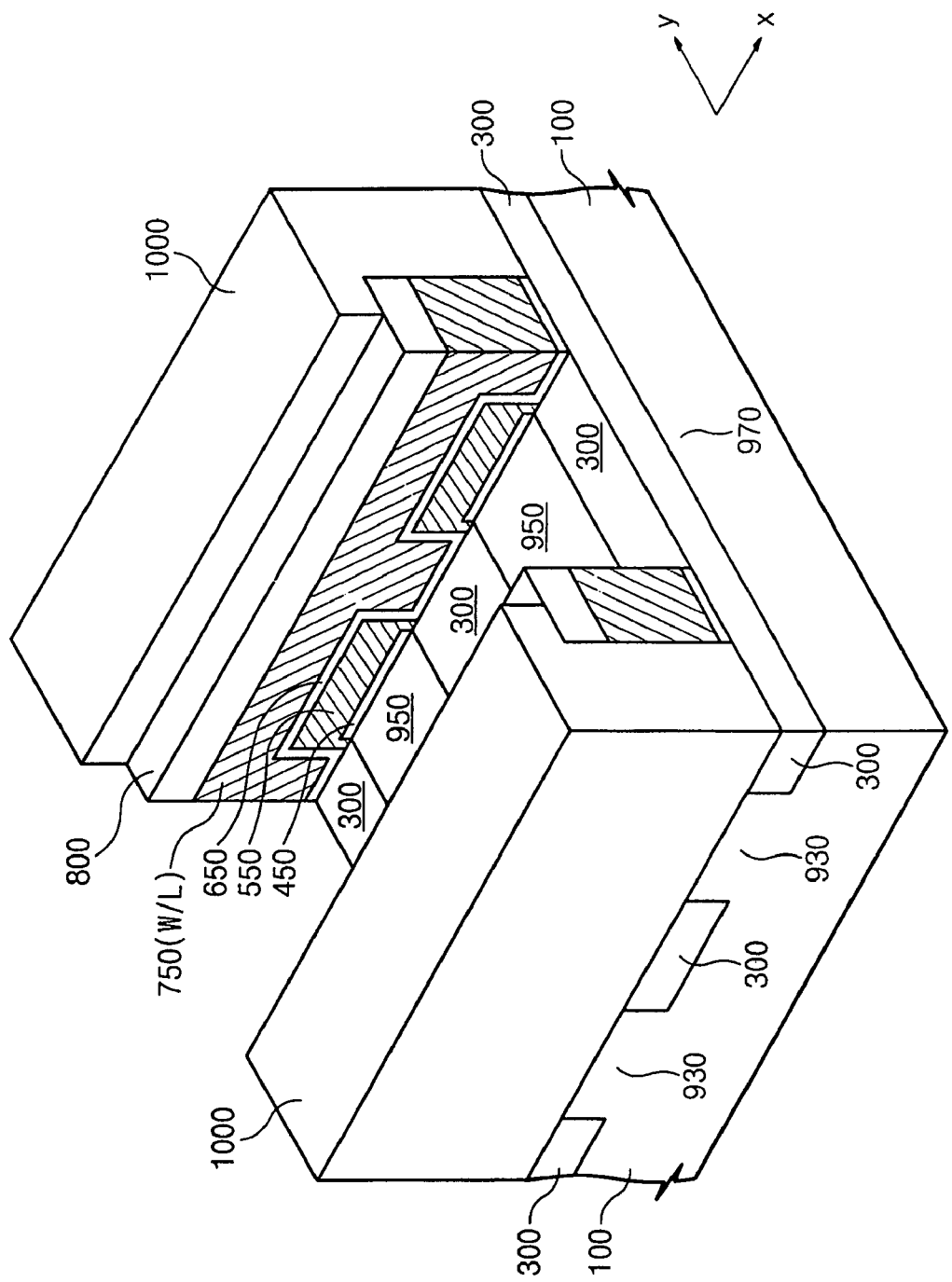

Referring to FIGS. 7A and 7B, the second conductive layer 700, the gate interlayer insulating layer 600, the first conductive layer 500 and the tunneling insulating layer 400 are etched using the hard mask 800 as an etch mask until the active region and the device isolation region are exposed, thereby forming a stacked gate structure 900 of a memory cell under the hard mask 800.

The stacked gate structure 900 is configured to include the patterned tunneling insulating layer 450, the floating gate 550, the gate interlayer insulating layer 650, and the control gate 750 over the active region, as illustrated above in FIG. 3A. Meanwhile, over the device isolation region 300, the stacked gate structure 900 is configured with the gate interlayer insulating layer 650 and the control gate 750 which are stacked in sequence, as illustrated above in FIG. 3C.

Herein, the active regions 930 and 950 disposed at respective sides of the stacked gate structure 900 are regions where a source and drain will be formed, respectively. Furthermore, the region 950 where the source will be formed (hereinafter, referred to as a source region 950) and a source connection region 970 corresponding to removed portions of the device isolation region 300 are provided as a common source line region 990 where a common source line will be formed.

Referring to FIGS. 8A through 8C, an etch mask 1000 is formed for forming a self-aligned source line such that the common source line region 990 is exposed but the region 930 where the drain will be formed (hereinafter, referred to as a drain region) is covered. Alternatively, if a portion of the drain region 930 is exposed, the device isolation region 300 between adjacent drains 120 may be also removed during a subsequent process so that adjacent drains may be connected to each other. Therefore, in consideration of error of photolithographic process, it is preferable that the etch mask 1000 for the self-aligned source should be formed on the top surface of the hard mask 800 adjacent to the drain region 930 as well as on the drain region 930 so that the etch mask 1000 completely covers the drain region 930. That is, the etch mask 1000 for the self-aligned source partially covers the top surface of the hard mask 800 adjacent to the drain region 930 and partially exposes the top surface of the hard mask 800 adjacent to the common source line region 990. The etch mask 1000, for example, may be formed through an exposure and development process after coating the photosensitive material, e.g., photoresist.

Figure 9A:
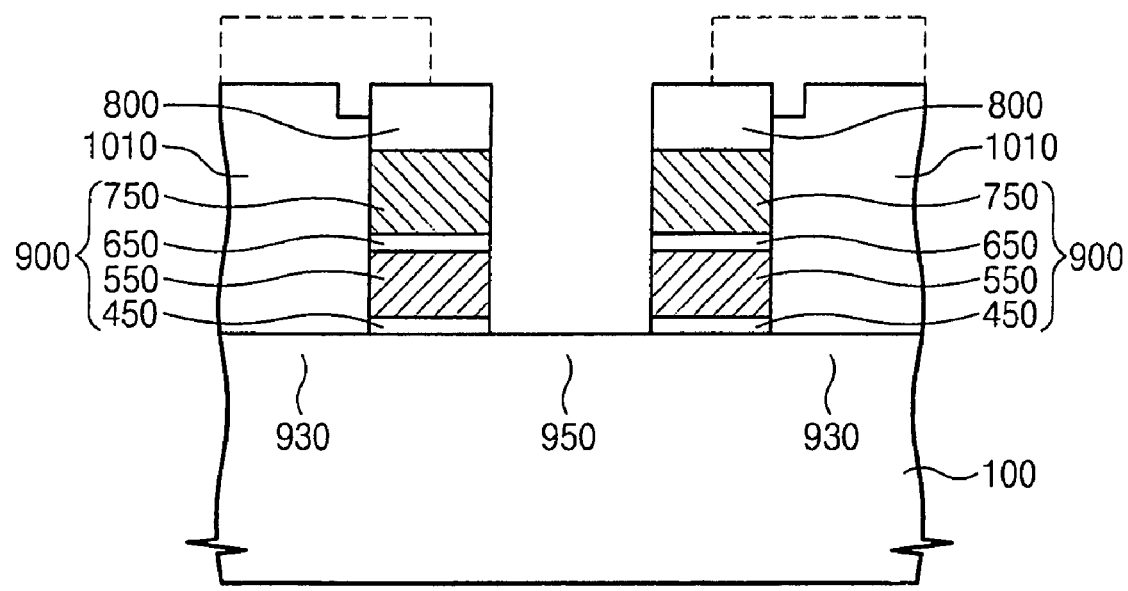
FIG. 9C is a perspective view corresponding to FIGS. 9A and 9B.
Figure 9B:
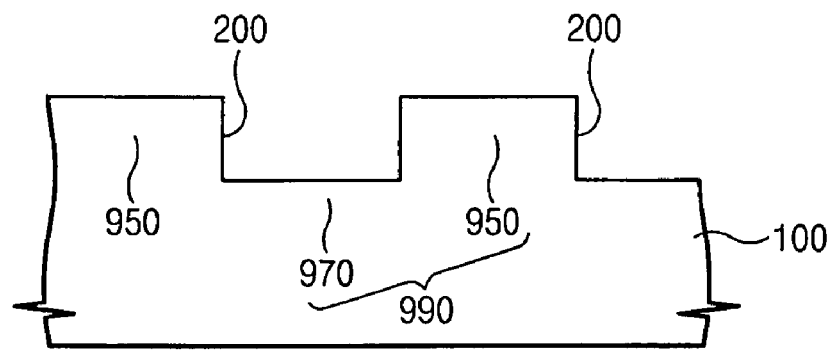
Figure 9C:
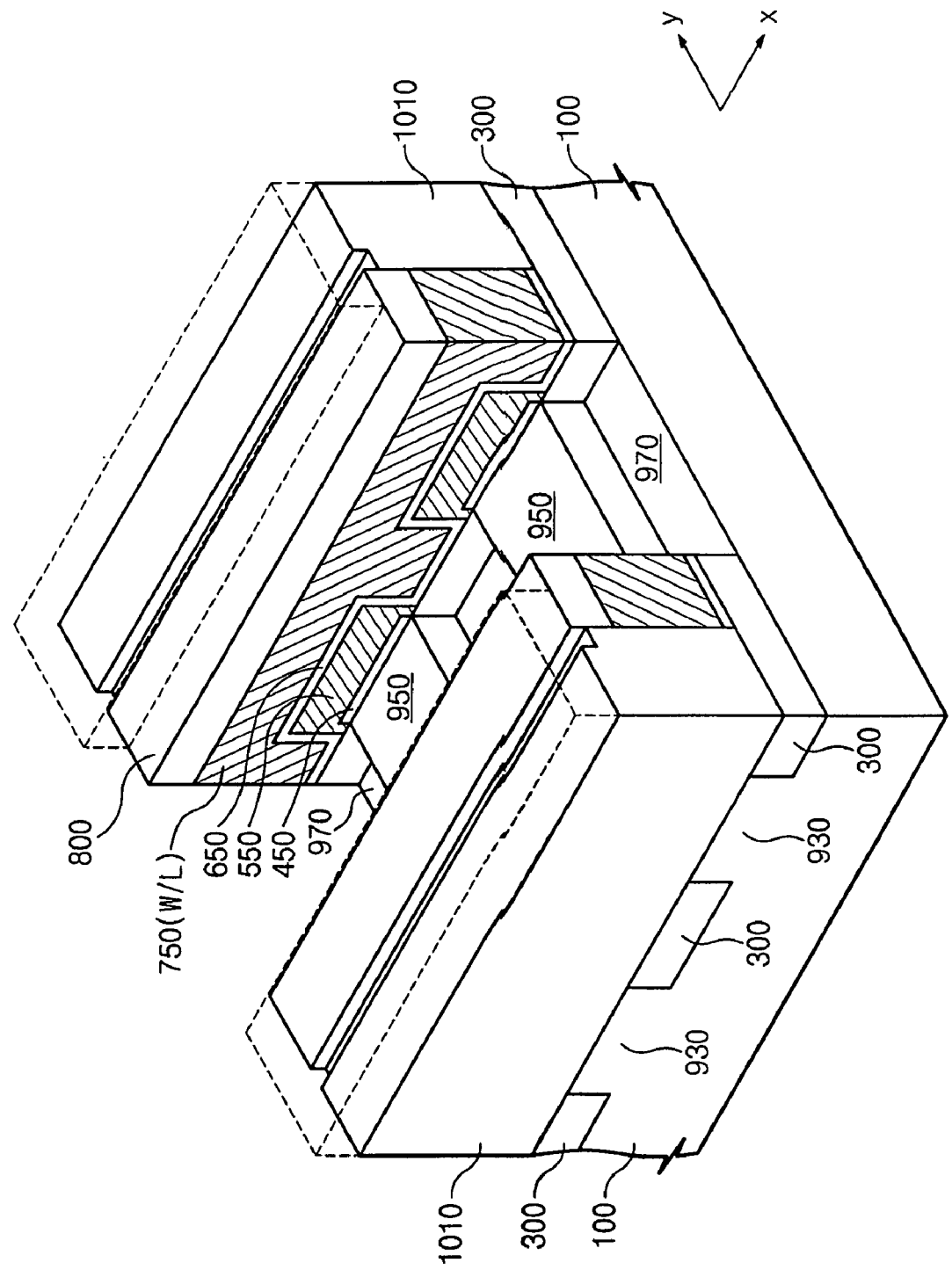

Referring to FIGS. 9A through 9C, an etching process is performed using the etch mask 1000 to thereby expose the entire top surface of the hard mask 800. As a result, a remaining etch mask 1010 completely covers the drain region 930 but exposes the common source line region 990 and the top surface of the hard mask 800.

According to the embodiment of the present invention, it is possible to readily form the remaining etch mask 1010 which exposes both the common source line region 990 and the entire top surface of the hard mask 800 by means of the etching process without the need for an additional photolithographic process, after forming the etch mask 1000 for the self-aligned source through the deposition, exposure and development process of the photoresist.

Herein, the etching of the etch mask 1000 may be performed using dry etching, wet etching, chemical mechanical polishing (CMP), etc. The dry etching, for example, may be performed using oxygen plasma.

The device isolation region 300 positioned between neighboring source regions 950 is removed from the common source line region 990. At this time, the hard mask 800 formed on the stacked gate structure 900 is removed at the same time. Therefore, the device isolation region 300 disposed at one side of the stacked gate structure 900 is removed so that the substrate 100 has a convex-concave profile, as shown in FIG. 9B.

Figure 10A:
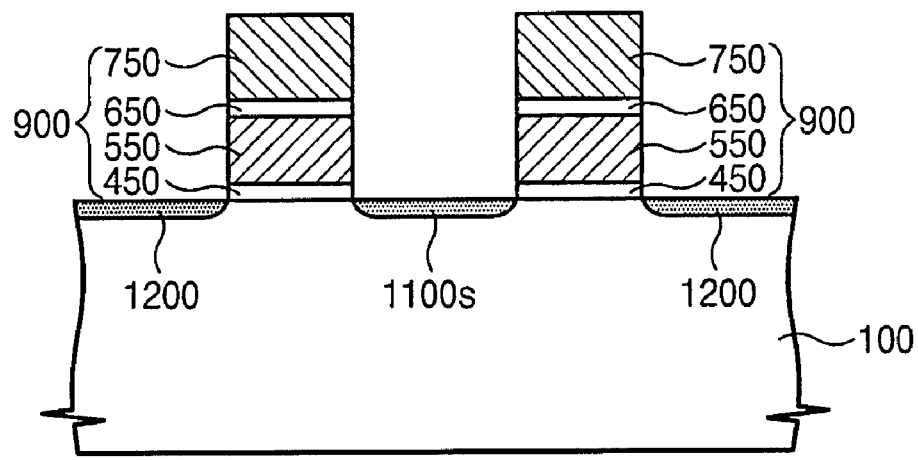
Figure 10B:
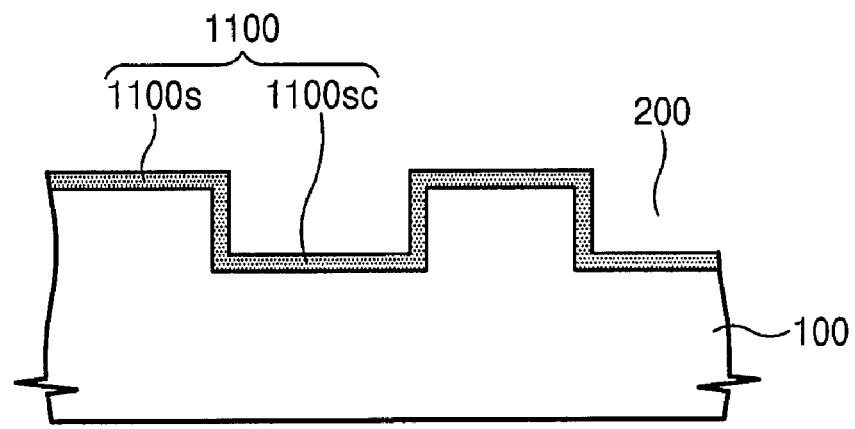

Referring to FIGS. 10A and 10B, after removing the remaining etch mask 1010 for the self-aligned source, an ion implantation process is performed to thereby form the common source line 1100 and the drain 1200. The common source line 1100 is formed along the convex-concave profile of the substrate 100 which is disposed at one side of the stacked gate structure 900. The common source line 1100 may be divided into two portions, i.e., a source 1100s and a source connection unit 1100sc for connecting adjacent source lines 1100s to each other, as shown in FIG. 2. That is, the impurity ions are implanted onto the active region 950 at one side of the stacked gate structure 900 so as to form the source 1100s. Meanwhile, the impurity ions are implanted onto the source connection region 970 where the device isolation region 300 has been removed so that the source connection unit 1100sc is formed at the source connection region 970. The drain 1200 is formed on the active region 930 at the other side of the stacked gate structure 900.

The ion implantation process may optionally be formed before forming the etch mask 1000 for the self-aligned source. That is, as illustrated in FIGS. 7A and 7B, the source and drain may be formed on the active region disposed at the respective sides of the stacked gate structure 900 by performing an ion implantation process. Subsequently, the forming of the etch mask 1000 for the self-aligned source, the etching process of the etch mask 1000, and the removal process of the device isolation region 300 and the hard mask 800 are performed in sequence, as illustrated in FIGS. 8A through 8C, and FIGS. 9A through 9C. Afterward, the impurity ions are implanted using the remaining etch mask 1010 to thereby form the source connection unit 1100sc which connects the adjacent sources 1100s to each other. As a result, the common 1100 source line is completed. Herein, the impurity ions may be additionally implanted onto the source 1100s which has been formed in advance.

In addition, the drain 1200 may optionally be formed after forming the common source line 1100. That is, before removing the remaining etch mask 1010 for the self-aligned source, the impurity ions are implanted to thereby form the common source line 1100. Subsequently, the remaining etch mask 1010 for the self-aligned source is removed, and thereafter, the impurity ions are implanted to form the drain 1200. During the ion implantation process for forming the drain 1200, the impurity ions may be additionally implanted onto the exposed common source line 1100.

Figure 11A:
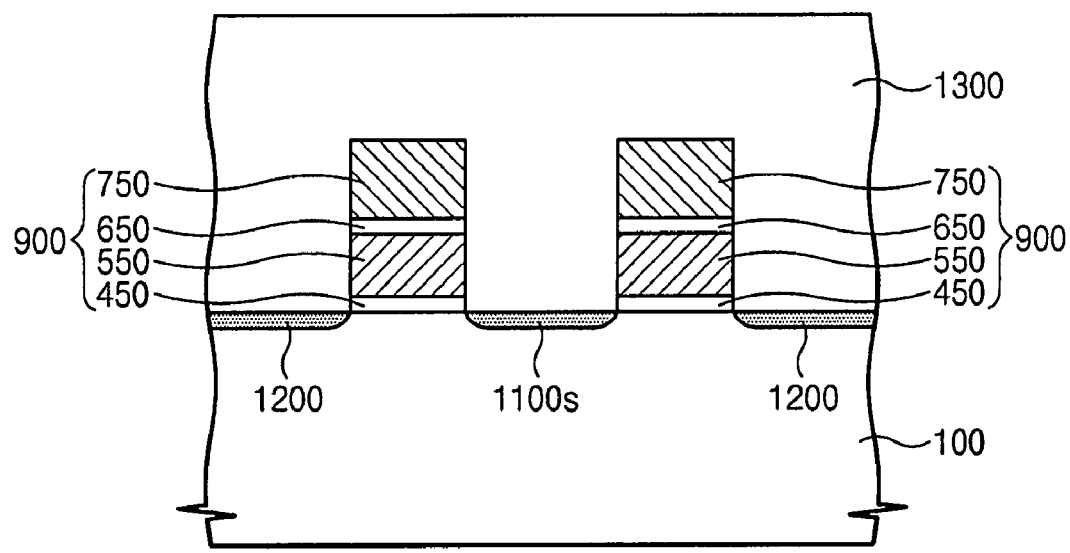
Figure 11B:
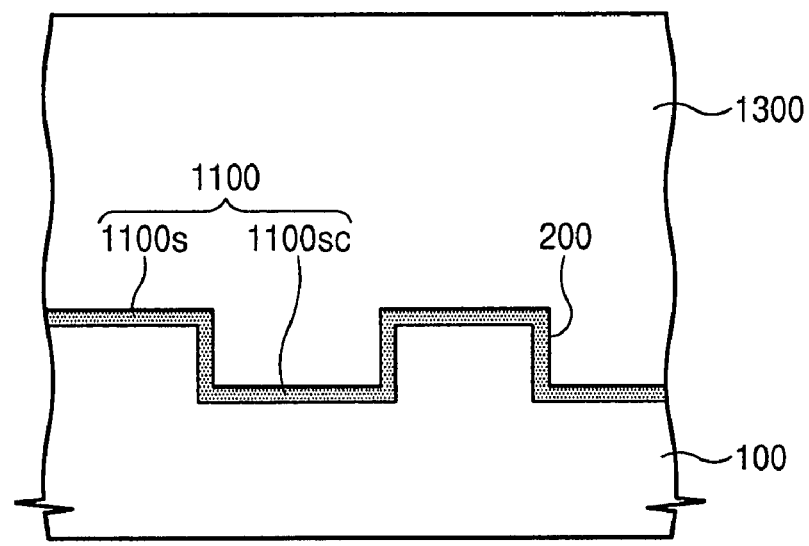

Referring to FIGS. 11A and 11B, an insulating material such as silicon oxide is deposited to form an interlayer insulating layer 1300. According to the embodiment of the present invention, since the hard mask 800 does not remain on the top surface of the stacked gate structure 900, the height of the stacked gate structure 900 becomes smaller so that it is possible to form the interlayer insulating layer 1300 between neighboring stacked gate structures 900 without a void. The interlayer insulating layer 1300 is in contact with the control gate 750, which is the uppermost layer of the stacked gate structure 900.

Figure 12A:
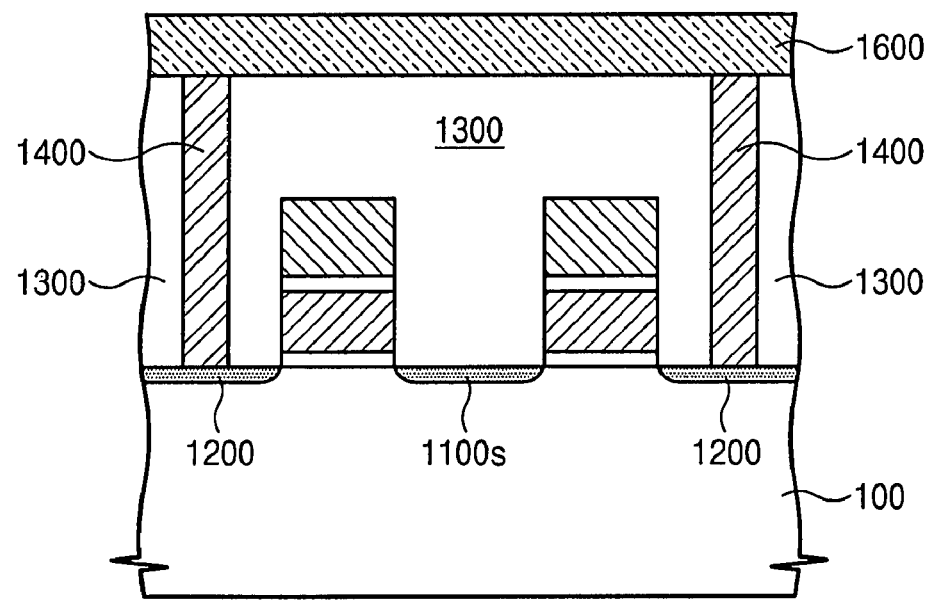
Figure 12B:
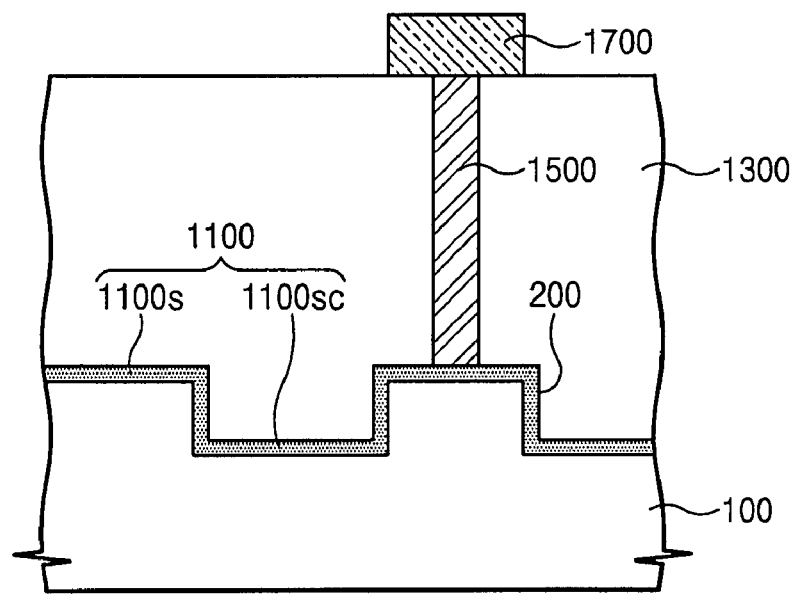

Referring to FIGS. 12A and 12B, the interlayer insulating layer 1300 is patterned into a predetermined configuration so as to form a contact hole exposing the drain 1200 and the common source line 1100. Thereafter, a conductive layer is formed inside the contact hole and over the interlayer insulating layer 1300. Afterwards, the conductive layer is patterned so as to form a bit line 1600 and a source line 1700. The bit line 1600 is electrically connected to the drain 1200 through a contact plug 1400, wherein the contact plug 1400 penetrates through the interlayer insulating layer 1300. Meanwhile, the source line 1700 is electrically connected to the common source line 1100 through a contact plug 1500 which penetrates through the interlayer insulating layer 1300.

Figure 13:
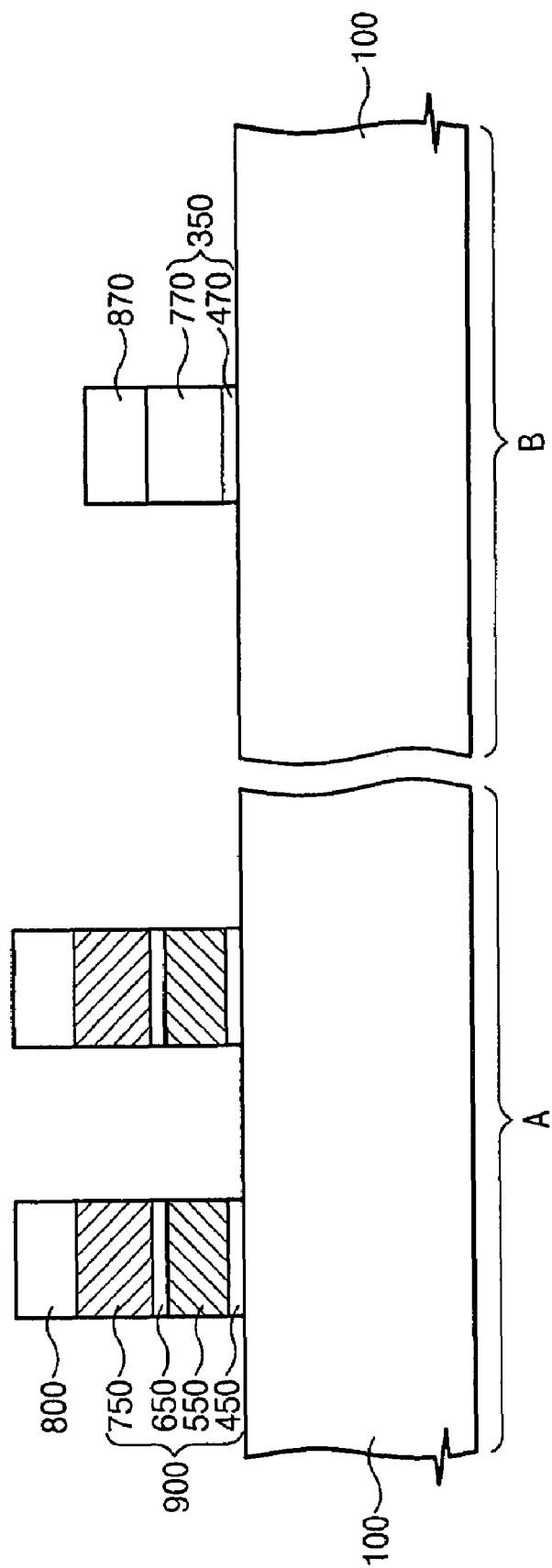
FIGS. 13 through 15 are schematic cross-sectional views illustrating a method of forming a nonvolatile memory device according to another embodiment of the present invention.
Figure 14:
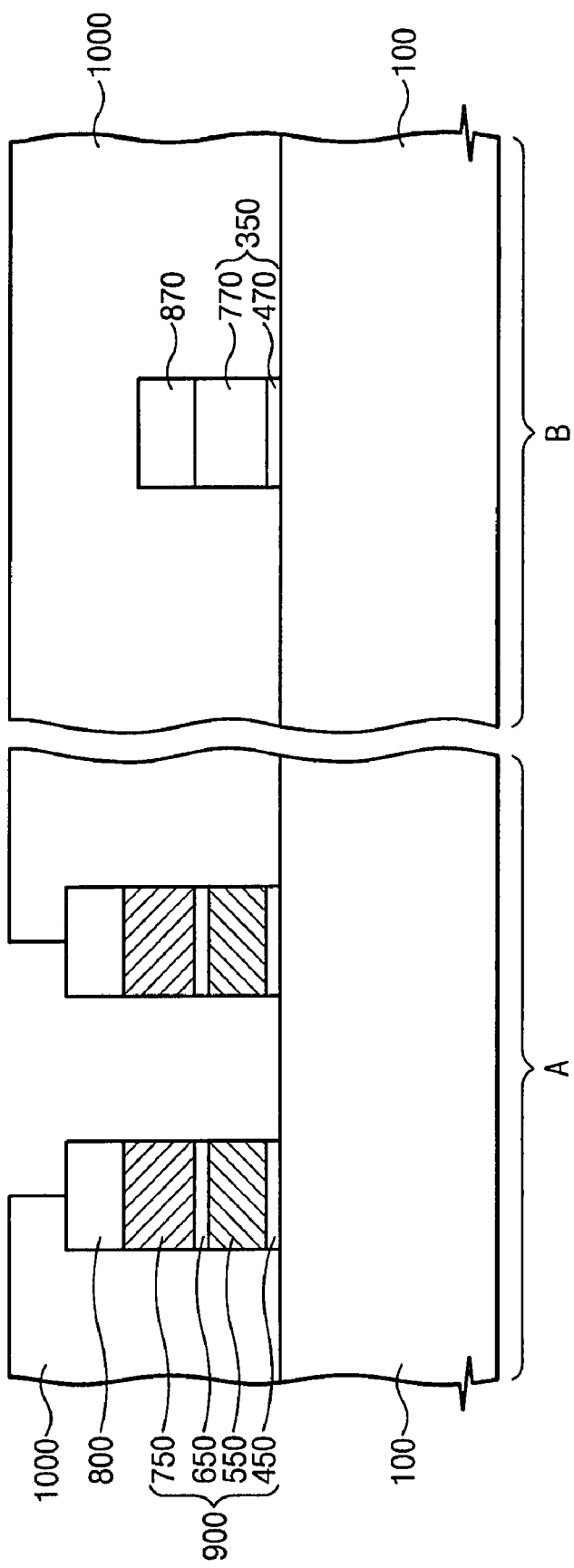
Figure 15:
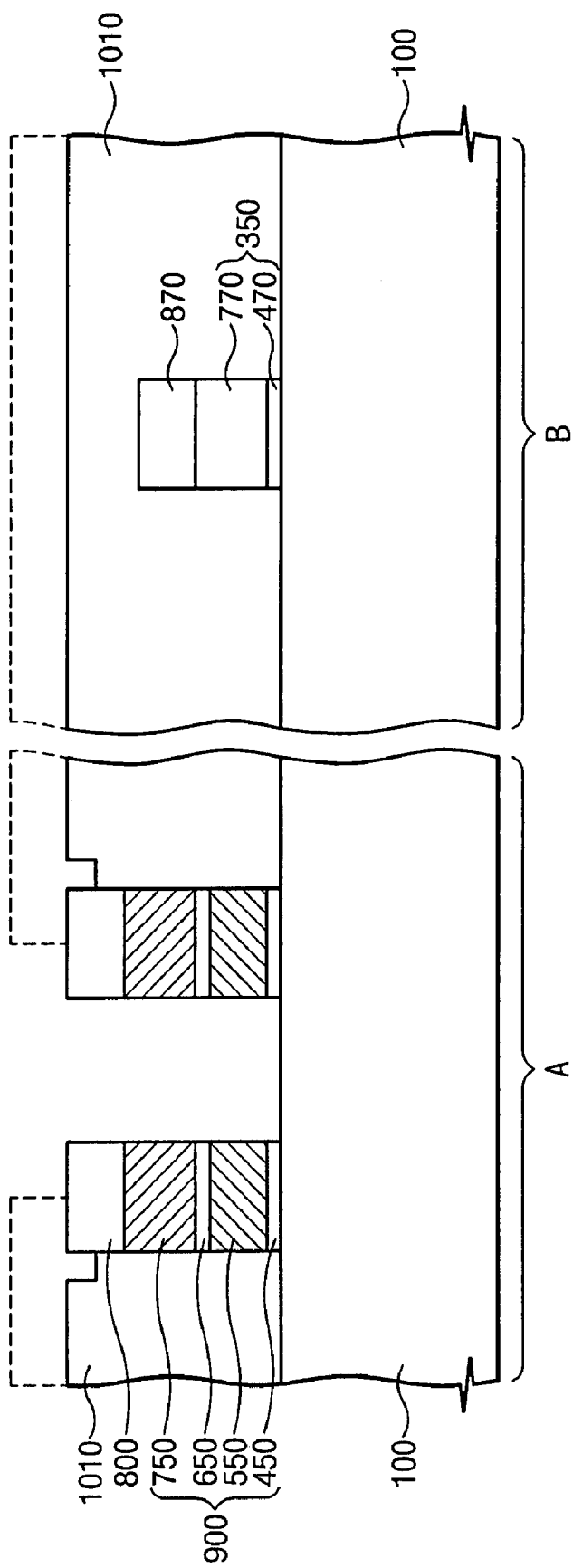

FIGS. 13 through 15 are schematic cross-sectional views illustrating a method of forming a nonvolatile memory device according to another embodiment of the present invention. In FIGS. 13 through 15, capital letters A and B denote a memory cell region and a peripheral circuit region B, respectively. The memory cell region A may be a region where NOR flash memory cells will be formed as described above. In addition, the peripheral circuit region B may be a region where a drive transistor required for driving the memory cell will be formed.

Referring to FIG. 13, the aforementioned processes are performed over the memory cell region A to thereby form a stacked gate structure 900 which is protected by a hard mask 800. On the other hand, a drive gate structure 350 is formed on the peripheral circuit region B, wherein the drive gate structure 350 is protected by a capping layer 870. The drive gate structure 350 includes a gate insulating layer 470 and a drive gate 770 which are stacked on the substrate 100 in sequence. Since a floating gate and a drive gate interlayer insulating layer are not formed in the drive gate structure 350 of the peripheral circuit region B, the drive gate structure 350 is at a height that is lower than that of the stacked gate structure 900 disposed in the memory cell region A. The drive gate 770 of the peripheral circuit region B may be formed out of the first conductive layer used for forming the floating gate 550 of the memory cell region A; Alternatively, the drive gate 770 may be formed out of the second conductive layer for forming the control gate 750 of the memory cell region.

Referring to FIG. 14, an etch mask 1000 for the self-aligned source is formed such that a common source line region is exposed. The etch mask 1000 for the self-aligned source covers the drive gate structure 350 of the peripheral circuit region B.

Referring to FIG. 15, a portion of the etch mask 1000 is removed such that the top surface of the hard mask 800 of the memory cell region A is entirely exposed, as stated above. At this time, it is noted that the capping layer 870 of the drive gate structure 350 of the peripheral circuit region B is not exposed. That is, since the drive gate structure 350 is lower than the stacked gate structure 900, the portion of the etch mask 1000 over the capping layer 870 of the peripheral circuit region B still remains so as to protect the capping layer 870 even though the portion of the etch mask 1000 that lies over the hard mask 800 of the memory cell region A is completely removed.

Thereafter, the device isolation layer formed on the common source line region of the memory cell region A is removed using the remaining etch mask 1010 as a mask for the removal procedure. At this time, the top surface of the hard mask 800 of the memory cell region A is completely exposed, and thus the hard mask 800 is removed at the same time as the device isolation layer. However, the remaining etch mask 1010 still remains on the top surface of the capping layer 870 of the peripheral circuit region B so that the capping layer 870 is not etched.

According to the present invention, the interlayer insulating layer can be formed between neighboring stacked gate structures while minimizing the likelihood of voids being formed therein so that it is possible to form a reliable semiconductor device, e.g., particularly a reliable nonvolatile memory device.

According to an inventive method of forming the nonvolatile memory device, since it is possible to easily remove the hard mask for forming the stacked gate structure of the nonvolatile memory device without any supplementary photolithographic process, it is possible to shorten a process time. In addition, it is possible to form the nonvolatile memory device economically without any supplementary photolithographic process in a short process time.

While the invention have been particularly shown and described with reference to preferred embodiments thereof, it will be understood by those skilled in the art that various changes in form and detail may be made herein without departing from the spirit and scope of the invention as defined by the appended claims.

What is claimed is:

1. A method of forming a nonvolatile memory device, the method comprising:
   sequentially forming a memory layer, a control gate and a first mask on a substrate, the substrate having a trench filled with a device isolation region;
   removing a portion of the device isolation region at a first side of the control gate, and removing the first mask on the control gate such that a top surface of the control gate is exposed;
   forming a common source line both in the substrate at the first side of the control gate and in the trench exposed by removing the portion of the device isolation region; and
   forming a drain in the substrate at a second side of the control gate.

2. The method of claim 1, wherein removing the device isolation region and the first mask comprises:
   forming a second mask that covers the substrate and the device isolation region at the second side of the control gate, and exposes a top surface of the first mask, and the substrate and the device isolation region at the first side of the control gate; and
   simultaneously removing the first mask and the device isolation region at the first side of the control gate using the second mask as an etch mask.

3. The method of claim 2, wherein each of the device isolation region and the first mask comprises silicon oxide.

4. The method of claim 2, wherein the common source line and the drain are formed simultaneously by implanting impurity ions after removing the second mask.

5. The method of claim 2, wherein the forming of the second mask comprises:
   forming a photoresist that covers the substrate and the device isolation region at the second side of the control gate, and a portion of the top surface of the first mask, and exposes the substrate and the device isolation region at the first side of the control gate; and
   etching a portion of the photoresist such that the top surface of the first mask is entirely exposed.

6. The method of claim 5, wherein each of the device isolation region and the first mask comprises silicon oxide.

7. The method of claim 5, wherein the common source line and the drain region are formed simultaneously by implanting impurity ions after removing the second mask.

8. The method of claim 5, wherein the sequential forming of the memory layer, the control gate and the first mask on the substrate having the trench filled with the device isolation region comprises:
   patterning the substrate to define an active region and to form the trench extending in a first direction;
   filling an insulating material into the trench to form the device isolation region;
   forming a first conductive layer for the memory layer over the active region, wherein a first insulating layer is interposed between the active region and the first conductive layer;
   forming a second conductive layer for the control gate over the first conductive layer and the device isolation region, wherein a second insulating layer is interposed therebetween;
   forming the first mask on the second conductive layer, wherein the first mask extends in a second direction which intersects with the first direction; and
   patterning the second conductive layer, the second insulating layer, the first conductive layer, and the first insulating layer using the first mask as an etch mask.

9. A method of forming a NOR flash memory device, the method comprising:
   providing a substrate including a floating gate formed on respective active regions which are defined between device isolation regions extending in a first direction, a plurality of control gates formed on the floating gate and the device isolation regions, and a first mask formed on each of the control gates, wherein a first insulating layer is interposed between the active region and the floating gate, and a second insulating layer is interposed between the control gate and the floating gate, the plurality of control gates extending in a second direction that intersects with the first direction;
   forming a second mask extending in the second direction, wherein the second mask exposes a common source line region, and partially exposes the top surface of the first mask adjacent to the common source line region, and covers a drain region;
   removing a portion of the second mask to expose the top surface of the first mask adjacent to the common source line region;
   removing the first mask and the device isolation region disposed at the common source line region; and
   implanting impurity ions to form a common source line at the common source line region, and to form a drain at the drain region, after removing the second mask.

10. The method of claim 9, wherein each of the device isolation regions and the first mask comprises silicon oxide.

11. The method of claim 10, further comprising:
    forming an interlayer insulating layer;
    forming a bit line on the interlayer insulating layer, wherein the bit line is electrically connected to the drains arranged in the first direction through first plugs which penetrate through the interlayer insulating layer, the first plugs being electrically connected to the drains; and
    forming a source line on the interlayer insulating layer, wherein the source line is electrically connected to the common source line arranged in the second direction through second plugs which penetrate through the interlayer insulating layer, the second plugs being electrically connected to the common source line.

12. The method of claim 11, wherein the top surface of the first mask formed on the control gate adjacent to the second plugs is entirely exposed when the top surface of the first mask adjacent to the common source line region is exposed by partially removing the second mask.

13. The method of claim 11, wherein the portion of the second mask is removed by performing a chemical mechanical polishing (CMP) process over the second mask until the top surface of the control gate is entirely exposed.

14. The method of claim 11, wherein the portion of the second mask is removed using oxygen plasma until the top surface of the control gate is entirely exposed.

15. A method of forming a nonvolatile memory device, the method comprising:

forming two stacked gate structures on a substrate using a first mask;

forming a second mask such that it exposes a first region between the two stacked gate structures, and covers a second region beyond the two stacked gate structures, wherein the second region is separated from the first region;

removing the first mask using the second mask as an etch mask, and simultaneously removing a device isolation region of the first region; and forming a common source line in the first region and a drain in the second region.

16. The method of claim 15, wherein the forming of the second mask comprises:

forming a photoresist layer such that it exposes the first region and covers the second region, wherein the photoresist layer covers a portion of the top surface of the first mask adjacent to the second region and exposes a portion of the top surface of the first mask adjacent to the first region; and removing the portion of the photoresist layer such that the top surface of the first mask adjacent to the second region is partially exposed, thereby entirely exposing the top surface of the first mask.

\* \* \* \* \*